United States Patent [19]
Kohchi et al.

[11] Patent Number: 6,081,825
[45] Date of Patent: Jun. 27, 2000

[54] SEMICONDUCTOR DEVICE, SEMICONDUCTOR CIRCUIT USING THE DEVICE, AND CORRELATION CALCULATION DEVICE, SIGNAL CONVERTER, AND SIGNAL PROCESSING SYSTEM USING THE CIRCUIT

[75] Inventors: Tetsunobu Kohchi, Hiratsuka; Mamoru Miyawaki, Isehara, both of Japan

[73] Assignee: Canon Kabushiki Kaisha, Tokyo, Japan

[21] Appl. No.: 08/592,571

[22] Filed: Jan. 26, 1996

[30] Foreign Application Priority Data

Jan. 31, 1995 [JP] Japan ................................. 7-014094

[51] Int. Cl.⁷ ..................................................... G06G 7/00
[52] U.S. Cl. ............................................................. 708/801
[58] Field of Search ................................... 364/807, 606

[56] References Cited

U.S. PATENT DOCUMENTS

| | | | |
|---|---|---|---|
| 5,305,250 | 4/1994 | Salam et al. | 364/807 |
| 5,420,807 | 5/1995 | Shou et al. | 364/606 |
| 5,565,809 | 10/1996 | Shou et al. | 364/606 |

FOREIGN PATENT DOCUMENTS

| | | |
|---|---|---|
| 2536922 | 6/1984 | France . |
| 2599526 | 12/1987 | France . |

OTHER PUBLICATIONS

Gregorian et al, "Analog MOS Integrated Circuits for Signal Processing", John Wiley & Sons, Inc. 1986, p. 413.
Patent Abstracts of Japan, vol. 013, No. 309 (P–898), Jul. 14, 1989 & JP 01 081082 A (Fuji Photo Film Co. Ltd), Mar. 27, 1989.
"Economical Majority Logic IC Realized by CMOS" Nikkei Electronics, 1973, 11.S., pp. 132–144.

*Primary Examiner*—Tan V. Mai
*Attorney, Agent, or Firm*—Fitzpatrick, Cella, Harper & Scinto

[57] ABSTRACT

In a semiconductor device in which one terminal of each of plural capacitors is connected to a corresponding multiple input terminal via a switch, and the other terminals of the capacitors are commonly connected to a sense amplifier, the other terminal of at least one capacitor is commonly connected to the sense amplifier via a second switch, thereby reducing circuit scale, increasing operation speed, improving operation precision, and saving power.

19 Claims, 10 Drawing Sheets

| NUMBER OF HIGH LEVEL INPUTS | S3 | S2 | S1 |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

FIG. 9

| ANALOGUE INPUT SIGNAL VOLTAGE | S3 | S2 | S1 |
|---|---|---|---|
| $0.0 \leq VA < 0.625$ | 0 | 0 | 0 |
| $0.625 \leq VA < 1.25$ | 0 | 0 | 1 |
| $1.25 \leq VA < 1.875$ | 0 | 1 | 0 |
| $1.875 \leq VA < 2.5$ | 0 | 1 | 1 |
| $2.5 \leq VA < 3.125$ | 1 | 0 | 0 |
| $3.125 \leq VA < 3.75$ | 1 | 0 | 1 |
| $3.75 \leq VA < 4.375$ | 1 | 1 | 0 |
| $4.375 \leq VA < 5.0$ | 1 | 1 | 1 |

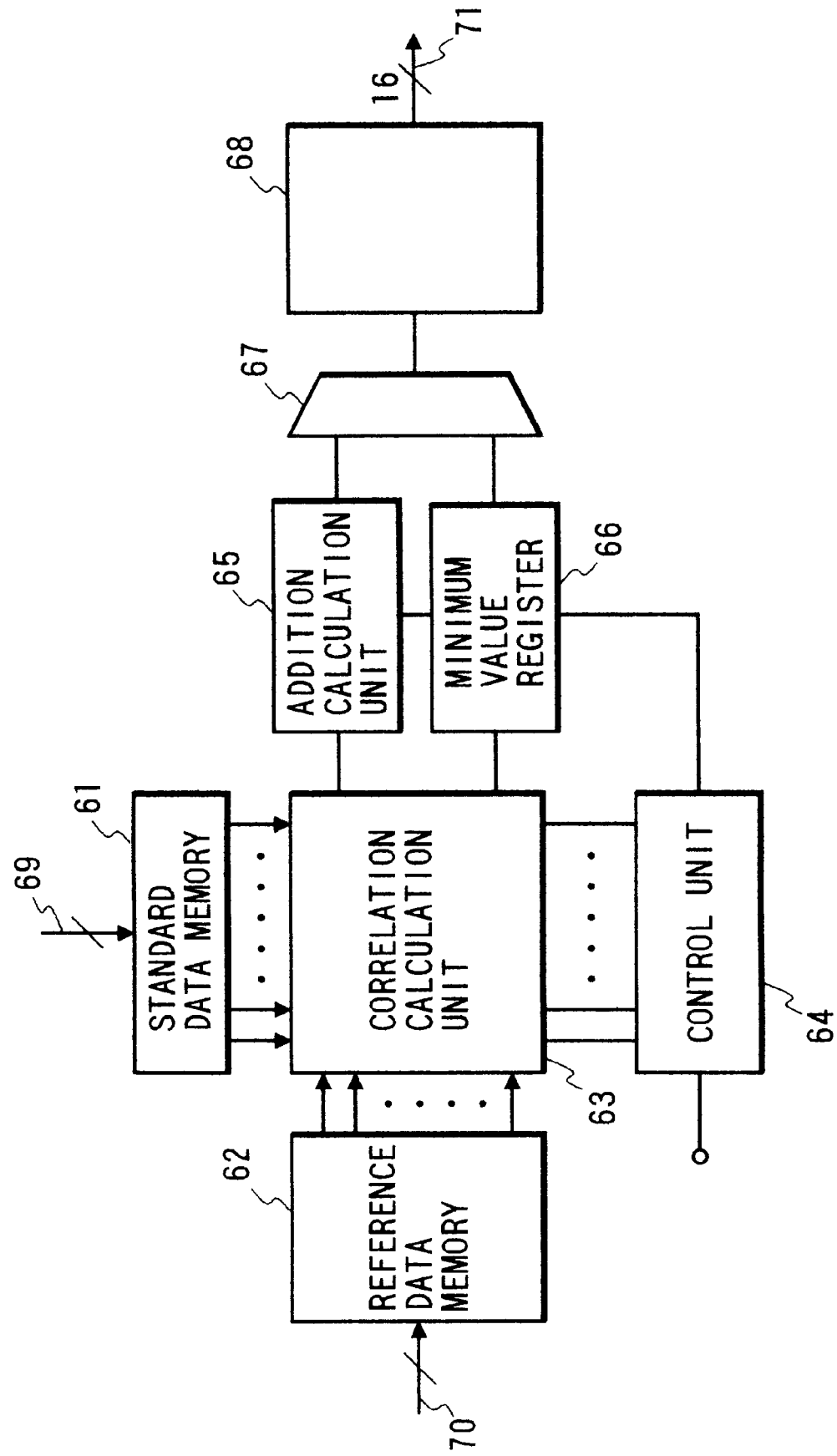

SEMICONDUCTOR DEVICE, SEMICONDUCTOR CIRCUIT USING THE DEVICE, AND CORRELATION CALCULATION DEVICE, SIGNAL CONVERTER, AND SIGNAL PROCESSING SYSTEM USING THE CIRCUIT

BACKGROUND OF THE INVENTION

1. Field of the Invention

The present invention relates to a semiconductor device, and a semiconductor circuit, a correlation calculation device, a signal converter, and a signal processing system using the semiconductor device and, more particularly, to a semiconductor device which can perform parallel arithmetic operations, a semiconductor circuit using the device, and a correlation calculation device, signal converters such as A/D and D/A converters, and a signal processing system, e.g., a system for processing an image signal, using the semiconductor device.

2. Related Background Art

In a conventional semiconductor device that performs parallel arithmetic operation processing, since the circuit scale increases in progression as the number of signals to be subjected to parallel arithmetic operations increases, the manufacturing cost of the semiconductor device increases, and the manufacturing yield is lowered. Due to an increase in delay amount of a signal transferred through, e.g., wiring lines or due to an increase in the number of times of arithmetic operations in the circuit upon an increase in circuit scale, the operation speed decreases. In addition, the consumption power increases considerably.

The above device will be described by taking, for example, the case of the solid-state image pickup device shown in FIG. 1. In the device shown in FIG. 1, time-series analog signals output from a sensing unit 60, in which image pickup elements 41 are arranged two-dimensionally, and which serves as an area sensor, are converted into digital signals by an A/D converter 40, and are temporarily stored in a frame memory 39. These signals are processed by an arithmetic operation circuit 38, and the processed signals are output from an arithmetic operation output circuit 50. More specifically, by executing correlation calculation between data obtained at different times, the moving amount ($\Delta X$, $\Delta Y$) of an object or the like can be output. The sensing unit 60 of this solid-state image pickup device has many output terminals. The frame memory 39 and the arithmetic operation circuit 38 also have many output terminals. In the solid-state image pickup device in FIG. 1, parallel arithmetic operation processing of signals from these output terminals is performed to shorten the processing time, or the number of processing steps is decreased to reduce the physical circuit scale, thereby increasing the processing speed and realizing real-time processing.

However, in order to perform real-time processing of a dynamic image, the number of arithmetic operations and the number of processing steps in the arithmetic operation processing are very large, and in order to obtain images with higher reality, the circuit scale increases in progression, resulting in a low processing speed. For example, an apparatus which can process an MPEG2 method proposed as a dynamic image expansion/compression method at a practical speed is still under development. The problems of the above-mentioned parallel arithmetic operation processing include not only the problem of a decrease in operation speed but also the problem of an increase in consumption of power upon an increase in circuit scale. In addition, the problem of an increase in manufacturing cost and the problem of a decrease in manufacturing yield upon an increase in circuit scale are posed.

Furthermore, a majority logic circuit effective for the arithmetic operation processing circuit is disclosed in Nikkei Electronics "Economical Majority Logic IC Realized by CMOS", 1973, 11. 5. pp. 132–144. However, this circuit, known is a majority logic circuit as one of the available digital signal processing methods, and is based on a CMOS technique. In this case as well, since the number of elements based on the CMOS technique increases, and the number of stages in the arithmetic operation processing increases, the problems of an increase in circuit scale, an increase in consumption of power, and a decrease in operation speed are similarly posed.

SUMMARY OF THE INVENTION

The present invention has been made in consideration of the above-mentioned problems, and has as its object to provide a semiconductor device which can reduce the circuit scale, increase the operation speed, and save power, and a semiconductor circuit, a correlation calculation device, a signal converter, and a signal processing system using the semiconductor device.

It is one aspect of the present invention to provide a semiconductor device in which one terminal of each of several capacitors connected to a corresponding one of multiple input terminals via a switch, and the other terminals of the capacitors are commonly connected to a sense amplifier, and the other terminal of at least one of the capacitor is commonly connected to the sense amplifier via a second switch, a semiconductor circuit having the semiconductor device, and a correlation calculation device, a signal converter, and a signal processing system using the semiconductor circuit are provided as well.

BRIEF DESCRIPTION OF THE DRAWINGS

FIG. 9 is a chart for explaining the relationship between analog signals and digital signals in A/D conversion performed by the signal converter in FIG. 8;

FIG. 10 is a schematic block diagram for explaining a case wherein the present invention is applied to a signal processing system like a motion detection device;

DETAILED DESCRIPTION OF THE PREFERRED EMBODIMENTS

Figure 1:
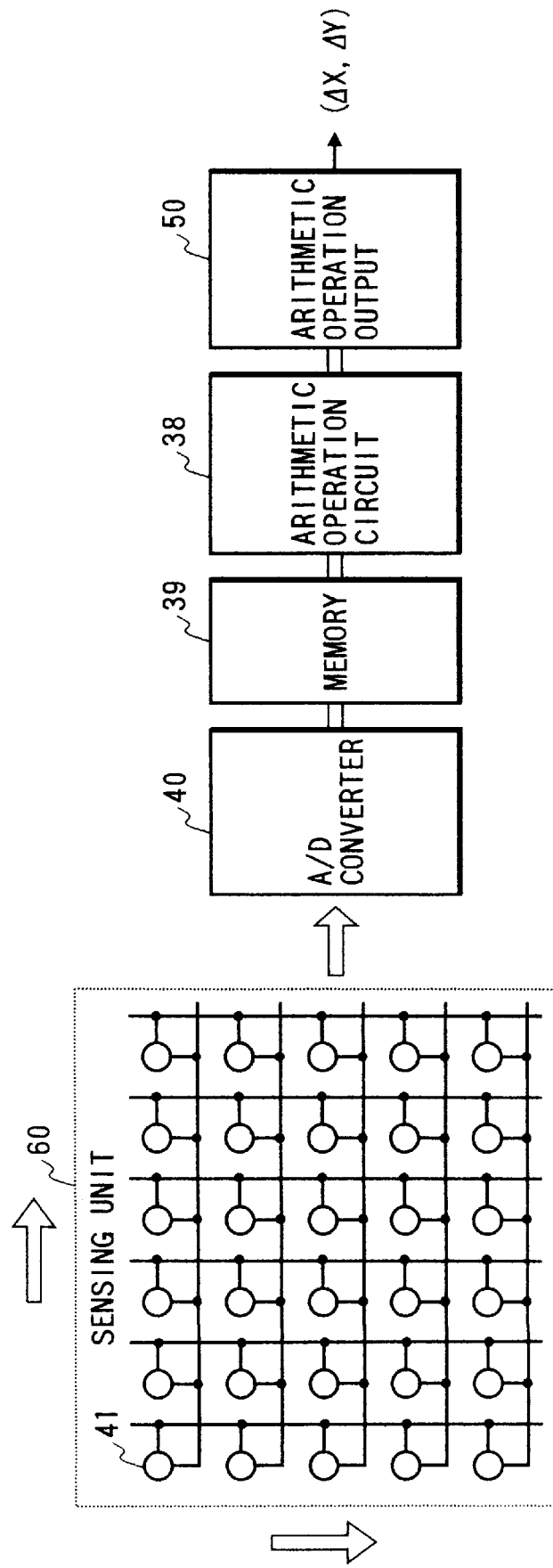
FIG. 1 is a schematic block diagram for explaining the arrangement of a solid-state image pickup device.

In the present invention, in order to achieve the above objects, one terminal of each of plural capacitors is connected to a corresponding multiple input terminal through a first switch means, and the other terminal of at least one of the capacitors is commonly connected to a sense amplifier through a second switch means.

That is, with the above arrangement, effects such as small circuit scale, high operation speed, and high arithmetic operation precision can be obtained.

In the above semiconductor device, since the output of a sense amplifier is connected to at least one of the multiple input terminals through a latch means, a majority arithmetic operation circuit can be realized with a simple circuit arrangement by performing weighting in accordance with the differences in capacitance value between the capacitor.

In addition, a plurality of semiconductor devices each identical to the above semiconductor device are prepared, and an output from the first semiconductor device of the plurality of semiconductor devices and/or an inverted output from the first semiconductor device is input to the second semiconductor device, thereby realizing a correlation operating or majority arithmetic operation circuit with a circuit with a small number of processing steps and capable of high-speed processing.

In a semiconductor circuit using the above semiconductor device, when the minimum capacitance of the capacitor corresponding to the multiple input terminals is represented by C, the total capacitance value of the commonly connected capacitor is set to be approximately an odd multiple of the minimum capacitance C, thereby realizing a majority arithmetic operation circuit with a simpler arrangement.

When a correlation operating device for performing a correlation arithmetic operation by comparison with correlation coefficients is formed by using the above semiconductor circuit, binary conversion or n-base value conversion using digital values can be realized with a simple arrangement. In addition, an A/D converter including the above semiconductor device receives an analog signal by means of the semiconductor device, and outputs a digital signal corresponding to the analog signal. With this arrangement, a high-precision A/D converter with a small number of processing steps for a multi-bit digital value can be realized. Similarly, a D/A converter including the above semiconductor device receives a digital signal by means of the semiconductor device, and outputs an analog signal corresponding to the digital signal. With this arrangement, a D/A converter with a high processing speed can be realized.

A signal processing system including the above correlation operating device or a signal converter such as the above A/D or D/A converter can be realized as a high-performance system with a simple arrangement having a small circuit scale and a high operation speed, which cannot be realized by the conventional techniques. This system includes, for example, an image input apparatus for receiving an image signal, and is used for image signal compression/expansion techniques. The system further includes a memory unit for storing information and can be applied to various operations such as image/audio signal compression/expansion and image interpolation/thinning.

In the application and use of the above semiconductor device, when the device includes a reset means for resetting the input terminal of a sense amplifier, the time required for a resetting operation performed by the reset means can be changed by ON/OFF-controlling the second switch means, thereby greatly shortening the processing time of a majority arithmetic operation circuit or a correlation operating circuit.

The preferred embodiments of the present invention will be described in detail below with reference to the accompanying drawings.

First Embodiment

Figure 2:
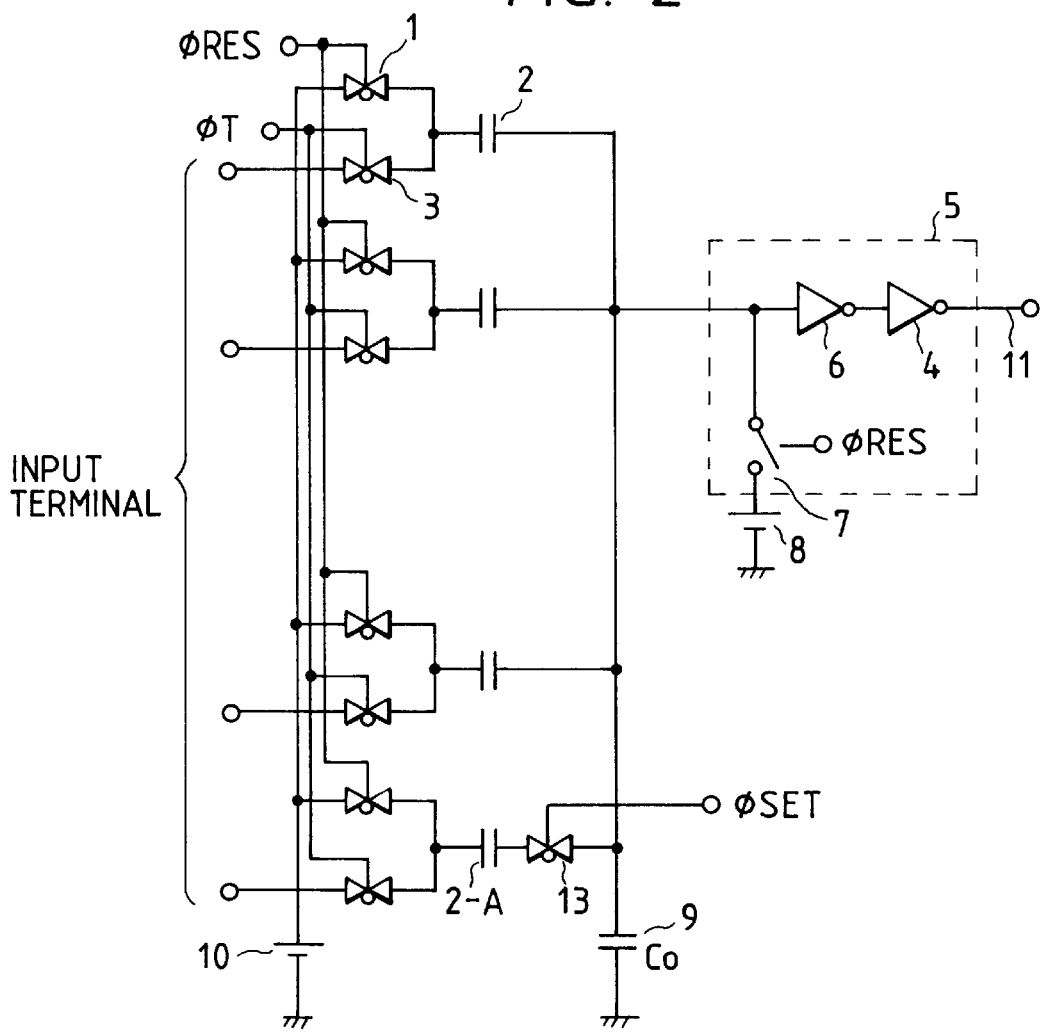
FIG. 2 is a schematic circuit diagram for explaining a preferred circuit arrangement of a semiconductor device of the present invention.

FIG. 2 is a schematic view for explaining the first embodiment of a semiconductor device of the present invention. Referring to FIG. 2, the semiconductor device includes a reset switch 1, capacitors 2 and 2-A, signal transfer switches 3, a sense amplifier 5, an inverter 6 in the sense amplifier 5, a second inverter 4 in the sense amplifier 5, a second reset switch 7 for resetting the input terminal of the inverter 6, a second reset power supply 8, a first reset power supply 10, an output terminal 11, and a parasitic capacitance 9 connected to the commonly connected terminals of the capacitors 2. However, the present invention is not limited to a structure having this parasitic capacitance 9. The semiconductor device also includes an input connection count switch 13.

Figure 3:
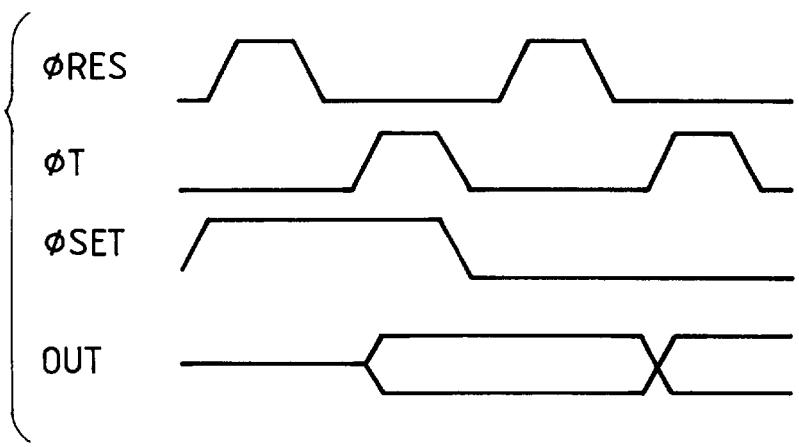
FIG. 3 is a timing chart for explaining an example of the driving timings of the device shown in FIG. 2.

FIG. 3 shows an example of the operation timings of this embodiment. The operation of this embodiment will be described below with reference to FIG. 3. First of all, the input connection count switch 13 is enabled by a pulse ΦSET, and the lowermost capacitor 2-A in FIG. 2 is connected to the input of the sense amplifier 5. Then, all the switches 1 are turned on by the reset pulse ORES to reset one terminal of each of the capacitors 2 and 2-A on the multiple input terminal side. The reset voltage of the first reset power supply 10 is preferably about ½ the signal amplitude. However, the reset voltage is not limited to this, but another voltage may be used. Alternatively, a plurality of voltages may be used. At substantially the same time, the input terminal of the inverter 6 in the sense amplifier 5 is reset by enabling the second reset switch 7. In this case, the reset voltage of the second reset power supply 8 is selected to be a value near the logic inversion voltage at which the output from the inverter 6 is inverted. When the reset pulse ΦRES is turned off, the two ends of each of the capacitors 2 and 2-A are held at the corresponding reset potentials.

When each transfer switch 3 is enabled by a transfer pulse ΦT, the signal is transferred to one terminal of the capacitor 2, and the voltage at one terminal of the capacitor changes from the reset voltage, e.g., 2.5 V, to a voltage VX. For example, let C be the capacitance of the capacitor 2, and $C_O$ be the capacitance of the parasitic capacitance. When N capacitors 2 are connected in parallel with each other, the potential at the commonly connected terminals of the capacitors 2 changes for a single input by capacitance division from the reset potential of the inverter 6 by:

$$|C \times (2.5 - VX)/(N \times C + C_O)| \tag{1}$$

When the input terminal voltage of the inverter 6 changes from a voltage near the logic inversion voltage, the output terminal voltage of the inverter 6 is inverted accordingly. When signals are input to the N inputs, a sum of N capacitance division outputs is input to the input terminal of the inverter 6. If the sum of the N inputs assumes a positive value, the input terminal of the inverter 6 shifts to a potential higher than the logic inversion voltage, and a high-level signal is output to the output terminal 11 of the sense amplifier 5. On the other hand, if the sum assumes a negative value, the input terminal of the inverter 6 shifts to a potential lower than the logic inversion voltage, and a low-level signal is output.

In this embodiment, respective input signals are weighted in correspondence with processing to be executed on the basis of the amplitudes of input signals and the capacitances of the capacitors 2 and 2-A which receive the signals, and these signals are simultaneously subjected to a parallel arithmetic operation in the sense amplifier 5. When the pulse ΦSET is set at low level, and the switch 13 is turned off, the lowermost capacitor 2-A in FIG. 2 is disconnected from the input of the sense amplifier 5. At this time, an arithmetic operation is performed for (N−1) inputs, i.e., all but the lowermost input. When the arithmetic operation logic changes, the voltage at the input terminal of the inverter 6 changes for a single input from the reset voltage by:

$$|C \times (2.5VX)/((N-1) \times C + C_O)| \qquad (2)$$

That is, this amount of change is larger than that given by equation (1) by $$(N \times C + C_O)/((N-1) \times C + C_O)(\text{times}) \qquad (3)$$

With this increase in the amount of change, the probability of operation errors caused by noise decreases, and the arithmetic operation precision improves. That is, with the input connection count switch in the present invention, a plurality of arithmetic operation logics can be realized with a simple arrangement and a high S/N ratio as compared with a conventional parallel arithmetic operation circuit. In addition, each arithmetic operation logic can be designed to maximize the arithmetic operation precision.

In this embodiment, the N capacitors 2 and 2-A each having the capacitance C are connected to each other. However, the present invention is not limited to this, but the capacitances of the capacitors may differ from each other for the respective input terminals. The number of capacitors to be connected through the switch 13 is not limited to one. As is apparent, for example, a plurality of capacitors 2-A and a plurality of switches 13 may be prepared, or a plurality of capacitors 2-A may be connected to one switch 13. Alternatively, a combination of these arrangements may be used. With such an arrangement, a desired arithmetic operation logic may be formed. Furthermore, as is apparent, a desired arithmetic operation logic may be formed by connecting a plurality of circuits, identical to the circuit in FIG. 2, to each other.

In the circuit of the first embodiment, the respective input signals are weighted in correspondence with arithmetic processing to be executed on the basis of the amplitudes of input signals and the capacitances of the capacitors 2 and 2-A which receive the signals, and these signals are simultaneously subjected to parallel arithmetic processing in the sense amplifier. This weighting operation can be performed by enabling the switch 13 using the pulse ΦSET. In the conventional devices, the number of parallel arithmetic processing operations increases, and input signals are delayed relative to each other due to, e.g., the delays of signals transmitted through connection wiring lines, or noise is mixed in signals due to crosstalk caused as the circuit arrangement is complicated. According to the above arrangement, such inconvenience can be avoided. As a result, high-speed, high-precision parallel arithmetic processing can be realized.

Even when, for example, the number of input terminals increases, the increase in circuit scale is only the increase in the number of capacitors and switches for weighting operations in proportion thereto, and arithmetic operation processing can be satisfactorily performed. A great reduction in the circuit scale and improvement in the manufacturing yield can be attained as compared to a conventional parallel arithmetic processing circuit. In addition, since the circuit scale is reduced, and the operation speed is increased, the consumption power can be saved, needless to say.

Second Embodiment

Figure 4:
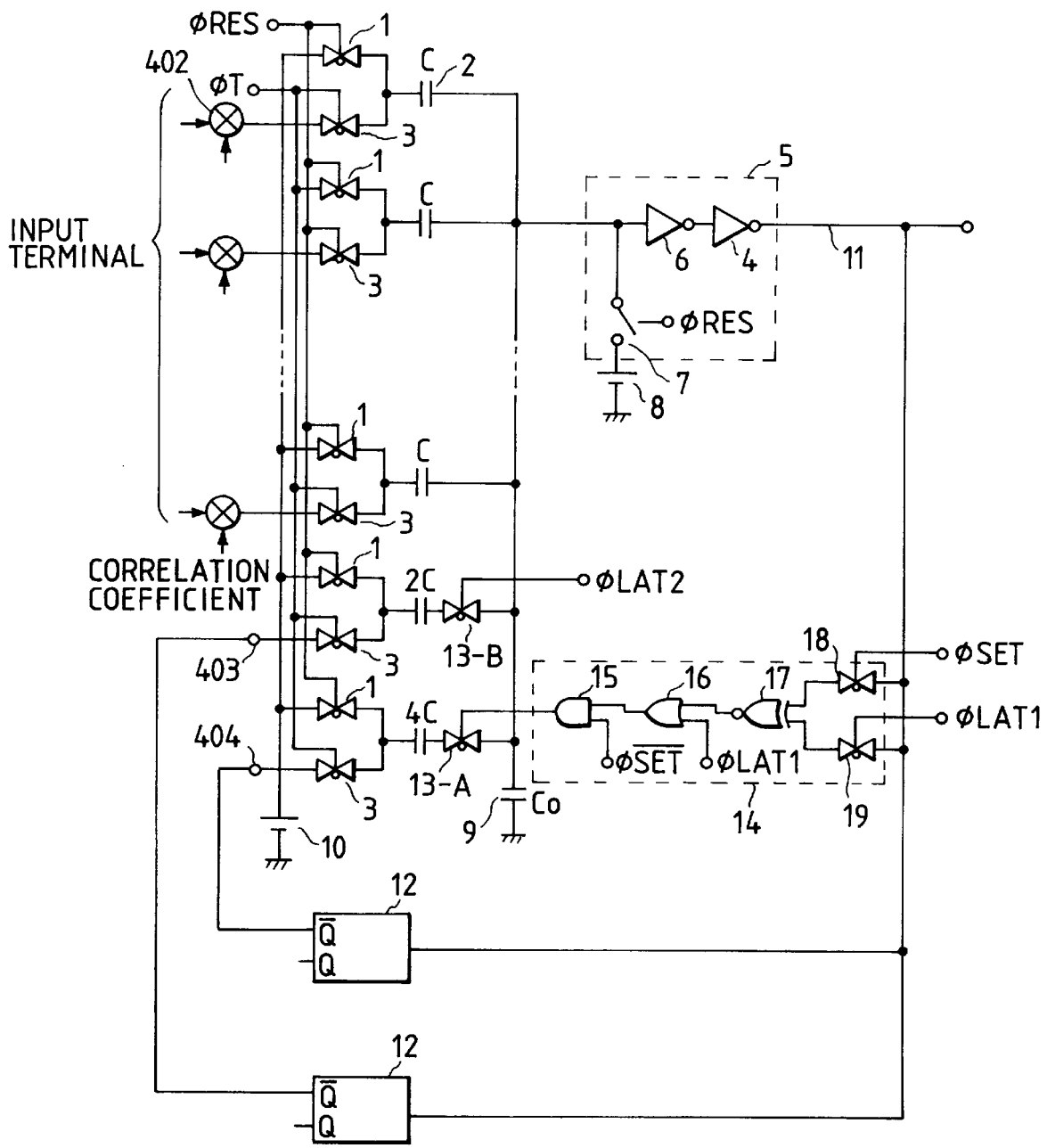
FIG. 4 is a schematic circuit diagram for explaining an example of a semiconductor circuit of the present invention.

FIG. 4 is a circuit diagram for explaining the circuit arrangement of a preferred embodiment in which the present invention is applied to a correlation calculation circuit. Referring to FIG. 4, this circuit includes comparators 402, latch circuits 12, and a pulse generation circuit 14 for controlling a switch 13-A. The pulse generation circuit 14 incorporates an AND gate 15, an OR gate 16, an EXNOR gate 17, and switches 18 and 19. Referring to FIG. 4, the circuit includes first and second weighted input terminals 403 and 404. Capacitors having capacitance values two and four times as large as that of a capacitor C connected to another input terminal path are respectively connected to the terminals 403 and 404. An output 11 from the circuit is output to an external unit and is also connected to the weighted input terminals 403 and 404 via the latch circuits 12.

Figure 5A:
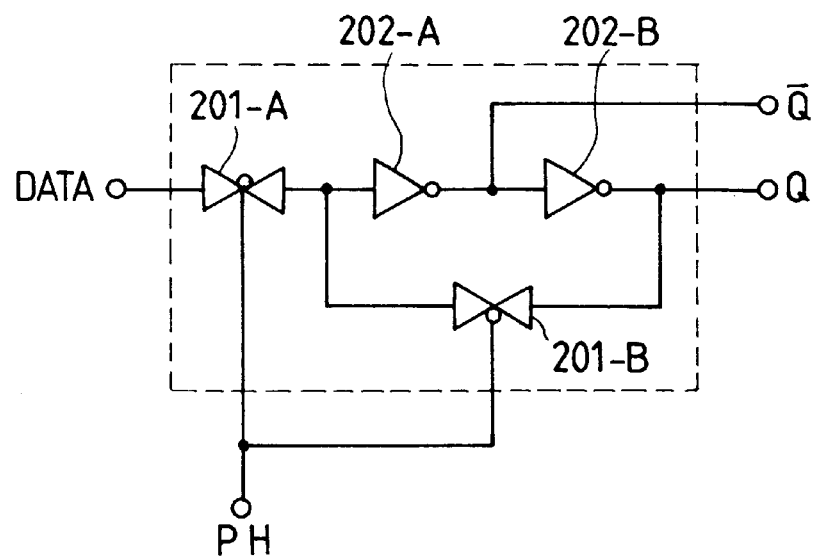
FIGS. 5A and 5B are schematic circuit diagrams showing examples of the arrangement of a latch circuit.
Figure 5B:
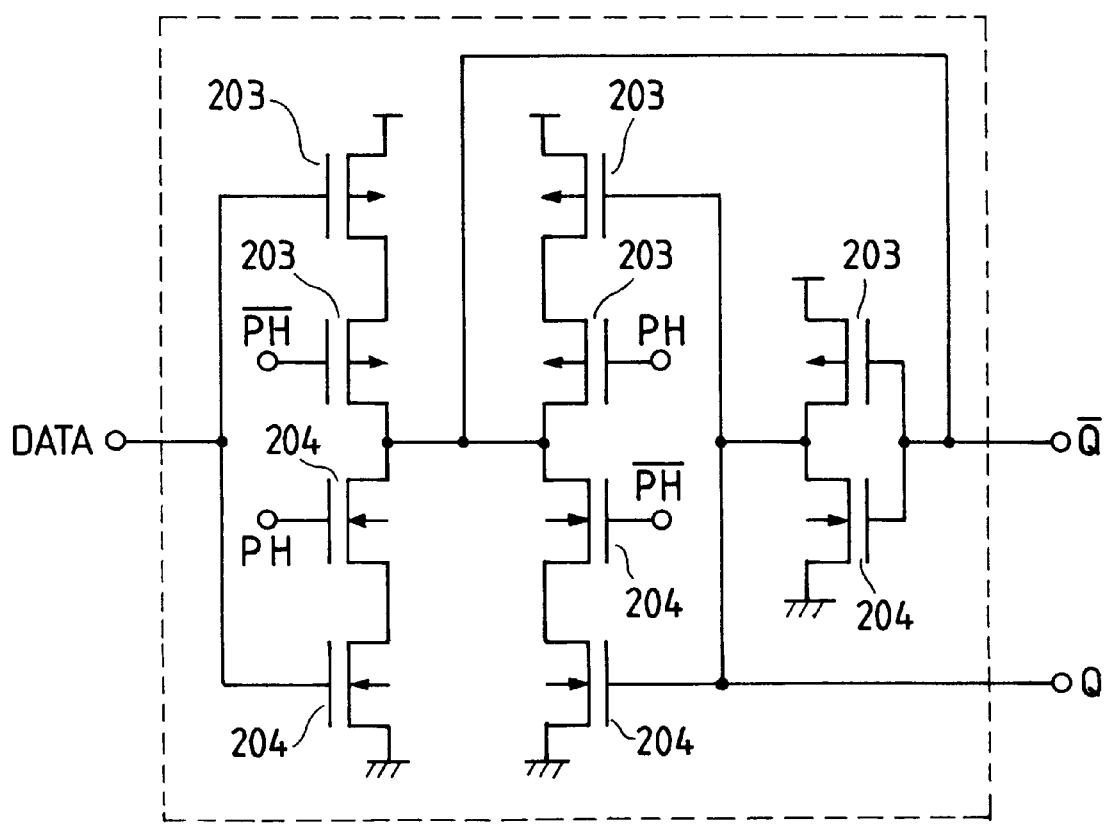

FIGS. 5A and 5B show examples of the arrangement of the latch circuit 12. Referring to FIG. 5A, this circuit includes transfer switches 201-A and 201-B and inverters 202-A and 202-B. When the transfer switch 201-A is enabled by a control signal PH, a signal Data is transferred to the input terminal of the inverter 202-A. When the transfer switch 201-A is disabled by the control signal PH, the transfer switch 201-B is enabled at the same time to form a positive loop with the inverters 202-A and 202-B, and keeps latching the signal Data until the transfer switch 201-A is enabled at the next timing. A non-inverted output Q with respect to the input signal Data is obtained from the inverter 202-B, and an inverted output $\overline{Q}$ is obtained from the inverter 202-A.

FIG. 5B shows another arrangement of the latch circuit. Referring to FIG. 5B, the latch circuit comprises PMOS transistors 203 and NMOS transistors 204. As in FIG. 5A, a signal Data is transferred using a control signal PH and an inverted control signal $\overline{PH}$, and the value of the transferred signal is latched until the next application timing of the control signal PH, thus outputting non-inverted and inverted outputs Q and $\overline{Q}$. In the circuits shown in FIGS. 5A and 5B, a binary signal is latched using the inverters. Alternatively, an analog value or a plurality of values may be latched by the latch circuit, and the present invention is not particularly limited to these latch circuits. For example, a circuit for latching an analog signal by adding a sample-hold circuit to the input of an amplifier circuit may be used.

Figures 6, 7:
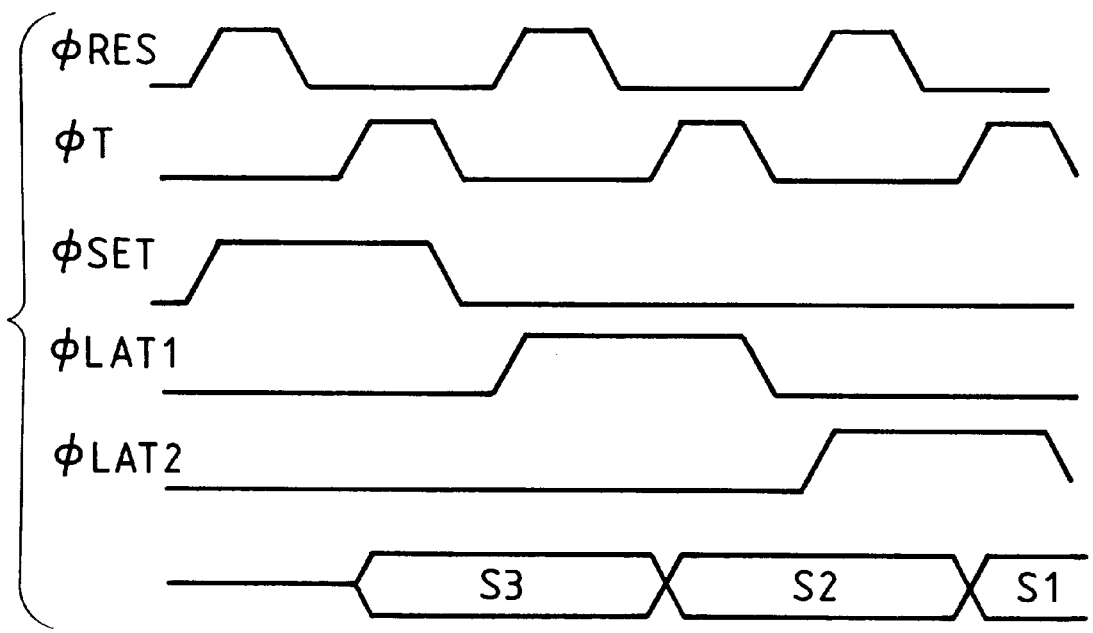
FIG. 6 is a timing chart for explaining an example of the driving timings of the circuit shown in FIG. 4.
FIG. 7 is a chart for explaining the relationship between inputs and outputs in a case wherein the circuit in FIG. 4 is used as a correlation calculation circuit.

FIG. 6 is a timing chart showing the operation timings of this embodiment. The latch circuit 12 is operated by a pulse ΦSET.

The basic operation of this embodiment will be described first with reference to FIG. 4. As in the first embodiment, since a pulse ΦLAT is at low level, and the pulse ΦSET is at high level (a pulse $\overline{\Phi SET}$ is set at low level), the switches 13-A and 13-B are disabled, and the weighted input terminals are disconnected from the sense amplifier 5.

Subsequently, the voltages at the two terminals of each capacitor 2 are reset to the corresponding reset voltages in response to a reset pulse ΦRES. When each transfer switch 3 is enabled by a transfer pulse ΦT, a signal is transferred to one terminal of the corresponding capacitor 2, and the potential at one terminal of the capacitor 2 changes to low or high level. The commonly connected terminal of each capacitor 2 changes for a corresponding input by capacitance division. When the input terminal voltage of the inverter 6 changes from the logic inversion voltage, the output terminal voltage of the inverter 6 is inverted accordingly. When signals are input to the N inputs, the sum of N capacitance division outputs is input to the input terminal of the inverter 6. Since the capacitors 2 provided to the input terminals other than the weighted input terminals have substantially the same capacitance values, if the number of high-level signals of N inputs is a majority, the input terminal of the inverter 6 shifts to a potential higher than the logic inversion voltage, and a high-level signal is output to the output terminal 11 of the sense amplifier 5. On the other hand, if the number of low-level signals is a majority, a low-level signal is output.

With the above arrangement, the circuit shown in FIG. 4 serves as a majority arithmetic operation circuit for outputting a logic value corresponding to the majority of a plurality of inputs. A 7-input correlation operation circuit will be described below with reference to FIG. 4. Referring to FIG. 4, seven signals are input to the comparators 402 together with correlation coefficients.

Each comparator 402 compares each input signal with a corresponding correlation coefficient. An output from each comparator 402 is then input to a corresponding transfer switch 3. If the number of high-level signals is a majority, i.e., when four out of seven inputs are high-level signals, a high-level signal is output to the output 11. Column S3 in FIG. 7 shows the output values of this circuit in units of the numbers of high-level signals of inputs. As shown in this column, when the number of high-level signals of input is four or more, the output value is "1". At this time, the output 11 is simultaneously latched by the latch circuits 12.

Since pulses ΦLAT1 and ΦSET are respectively set at high level and a low level, the outputs of the OR gate 16 and the AND gate 15 are set at high level. As a result, the switch 13-A is enabled, and a capacitor 4C, of the weighted terminal, which has a capacitance four times larger than that of the capacitor 2 is connected to the input terminal of the sense amplifier 5. In this circuit, this operation is equivalent to common connection of 11(7+4) capacitors C. The circuit serves as an 11-input majority operation circuit block, in which an inverted signal of the previous arithmetic operation result is applied to the weighting capacitor 4C.

If, for example, four out of seven inputs to the input terminals are at high level, an inverted terminal $\overline{Q}$ of the latch circuit 12 is set at low level, and a low-level signal is applied to the weighted input terminal 404. If six out of seven input signals applied to the input terminals other than the weighted input terminals are at high level, the 11-input majority arithmetic operation circuit determines a majority in total, and outputs a high-level signal. If four or more or five or less out of seven inputs are at high level, the 11-input majority arithmetic operation circuit determines that a majority is not achieved, and outputs a low-level signal. Column S2 in FIG. 7 shows these output values in units of the numbers of high-level signals to the seven inputs. As shown in this column, when the number of high-level inputs is 2, 3, 6, or 7, the output value is "1".

Similarly, since a pulse ΦLAT2 is set at high level, the switch 13-B is enabled, and a capacitor 2C, of the weighted terminal, which has a capacitance value twice that of capacitor 2, is connected to the input terminal of the sense amplifier 5. The switch 13-A is ON/OFF-controlled in accordance with the polarities of signals shown in columns S3 and S2 in FIG. 7. In this circuit in FIG. 4, this operation is equivalent to common connection of 9(7+2) capacitors C. This circuit serves as a 9-input majority arithmetic operation circuit, in which an inverted signal of the previous arithmetic operation result is applied to the weighting capacitor 2C. Alternatively, this operation is equivalent to common connection of 13(7+ 2+4) capacitors C. This circuit serves as a 13-input majority arithmetic operation circuit, in which an inverted signal of the previous arithmetic operation result is applied to six of the commonly connected capacitors.

If, for example, six out of seven inputs are at high level, the output S2 in FIG. 7 is at high level, and the inverted terminal $\overline{Q}$ of the latch circuit 12 is set at low level. As a result, low-level signals are applied to the weighted input terminals 404 and 403. The output of the EXNOR gate 17 is set at high level, and the outputs of the OR gate 16 and the AND gate 15 are also set at high level to enable the switch 13-A. This circuit then serves as a 13-input majority arithmetic operation circuit. If all the seven inputs are at high level, the 13-input majority arithmetic operation circuit determines a majority in total, and outputs a high-level signal. If six outputs of the seven inputs are at high level, a majority is not determined, and a low-level signal is output. Column S1 in FIG. 7 shows these output values in units of the numbers of high-level signals to the seven inputs.

With the above circuit arrangement, as shown in FIG. 7, the number of inputs, of a plurality of inputs, at which signals and correlation coefficients coincide with each other can be output upon conversion into a binary number with three digits. That is, according to this embodiment, correlation calculation can be performed with a very small circuit and low power consumption.

By changing the number of parallel connections of inputs with a change in arithmetic operation logic, the operation precision in each arrangement can be improved.

The arrangement of the pulse generation circuit 14 is not limited to the one shown in FIG. 4, but another scheme may be used.

As described above, in the second embodiment, the amplitudes of input signals and the capacitance values of the capacitors which receive the signals are properly determined, and the respective input signals are weighted to the output feedback level, through the latch circuits, in accordance with processing to be executed. These signals are simultaneously subjected to a parallel arithmetic operation in the sense amplifier. This embodiment basically exemplifies a majority arithmetic operation circuit together with a 3-digit binary arithmetic operation circuit. This arrangement can satisfactorily suppress relative delays of input signals due to delays of signals transmitted through connection wiring lines upon an increase in the number of parallel arithmetic operations, and the like, or mixing of noise in signals due to crosstalk. A binary arithmetic operation result with a plurality of digits can be easily obtained by controlling the supply timing of each pulse. As a result, high-speed, high-precision parallel arithmetic operation processing can be performed.

An arithmetic operation circuit is constituted by capacitors between multiple input terminals and common terminals, weighting capacitors, and switches which electrically connect/disconnect the weighting capacitors. That is, a great reduction in circuit scale and an increase in manufacturing yield can be attained as compared with a conventional parallel arithmetic operation circuit. In addition, with a reduction in circuit scale and an increase in operation speed, a reduction in consumption power can be attained, needless to say.

Third Embodiment

Figure 8:
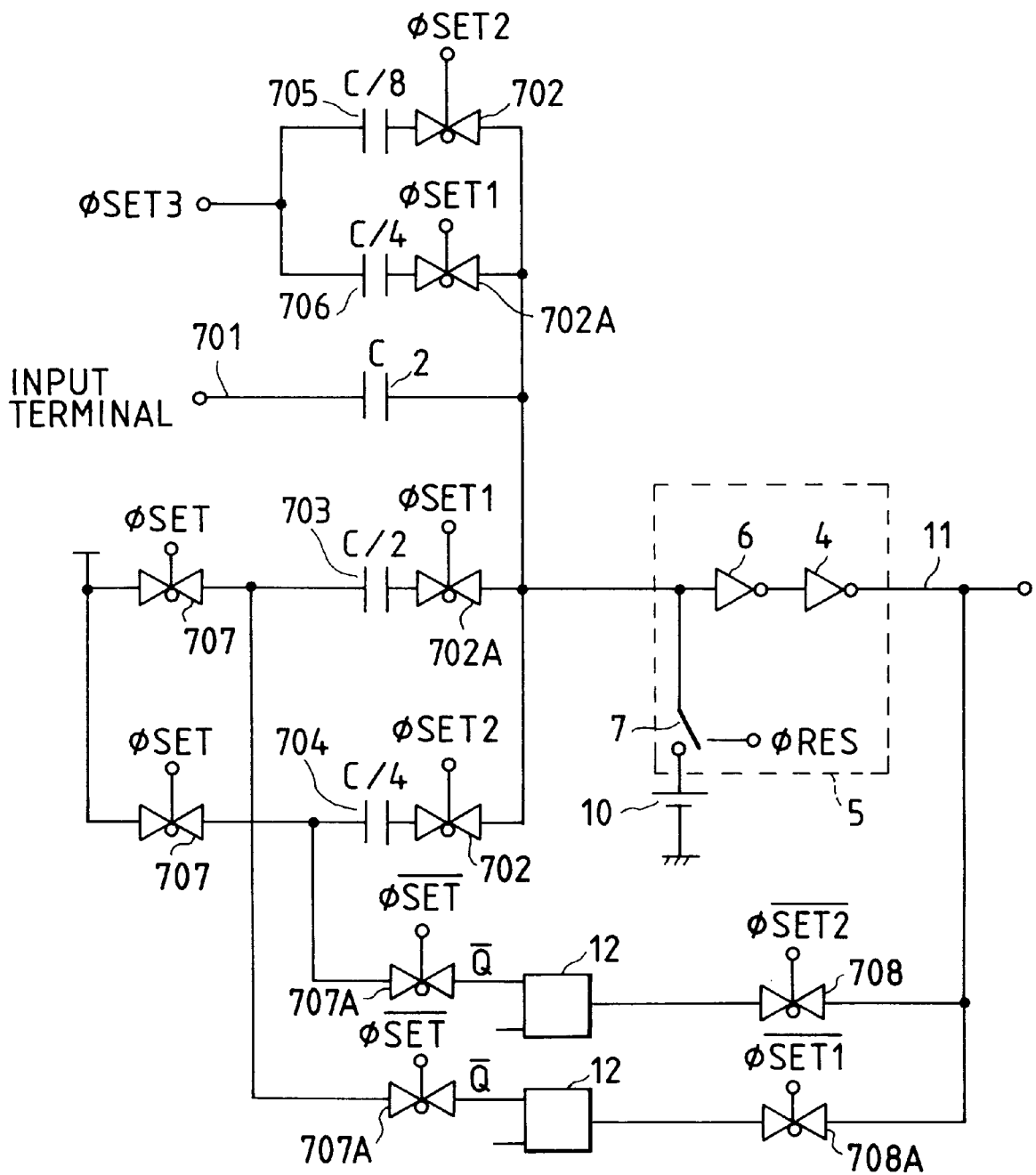
FIG. 8 is a schematic circuit diagram for explaining a case wherein the semiconductor circuit of the present invention is used as a signal converter.

FIG. 8 is a schematic circuit diagram for explaining the circuit arrangement of an embodiment in which the present invention is applied to a 3-bit analog-to-digital conversion circuit (to be referred to as an A/D converter hereinafter) as a signal converter. Referring to FIG. 8, the A/D converter includes an analog signal input terminal 701, switches 702, 702A, 707, 707A, 708, and 708A, latch circuits 12, a capacitor 703 having a capacitance value half that of a capacitor 2 provided to the analog signal input terminal, capacitors 704 and 706 each having a capacitance value ¼ that of the capacitor 2 provided to the analog signal input terminal, and a capacitor 705 having a capacitance value ⅛ that of the capacitor 2. The operation will be described below while taking as an example a case wherein a power supply of 5 V is used. First, the input terminal of a sense amplifier 5 is reset to 0 V. At this time, the signal input terminal 701 is at 0 V. When the analog signal input terminal 701 is changed from 0 V to an analog signal voltage, and the analog input signal becomes equal to or higher than about 2.5 V, the sense amplifier input potential in an arithmetic operation circuit block exceeds a logic inversion voltage (assumed to be 2.5 V in this case), thus outputting a high-level signal.

Column S3 in FIG. 9 shows the output results. Since both pulses ΦSET1 and ΦSET2 are at low level, the switches 708 and 708A are ON. For this reason, the arithmetic operation result is latched by the latch circuits 12 as soon as it is output. The switches 702A are enabled (the switch 708A is disabled) in response to a pulse ΦSET1. Then, one terminal of the capacitor 703 is reset to 5 V in response to a pulse ΦSET. At the same time, one terminal of the capacitor 706 is reset to 5 V in response to a pulse ΦSET3. The pulse ΦSET is turned off to enable the switch 707A so as to input the signals from the latch circuits 12 to the capacitors 703 and 704, and at the same time, one terminal of the capacitor 706 is set at 0 V in response to the pulse ΦSET3. At this time, the potential change at the input terminal of the sense amplifier is given by:

$$\{C \times VA - (C/2) \times 5 - (C/4) \times 5\}/(C + C/2 + C/4) \quad (4)$$

where VA is the analog input signal voltage.

As can be seen from this formula, a high-level signal is output when the analog signal voltage VA is equal to or higher than 3.75 V at the current timing; a low-level signal is output when the voltage VA is equal to or higher than 2.5 V and less than 3.75 V. Column S2 in FIG. 9 below shows the outputs results. Subsequently, a similar arithmetic operation is performed in response to the pulses ΦSET2, ΦSET, and ΦSET3. Column S1 in FIG. 9 below shows the output results. With the above arrangement, as shown in FIG. 9, an A/D converter for converting an analog signal voltage into a 3-bit digital signal, and outputting the digital signal can be realized by a very small-scale circuit arrangement that allows a high operation speed and low consumption power.

In this embodiment, the 3-bit A/D converter has been described. However, the present invention is not limited to this, as a matter of course, and the number of bits can be easily increased. In this embodiment, a flash-type A/D converter using capacitors has been exemplified. However, the present invention is not limited to this.

In this embodiment, the correlation operating device and the A/D converter have been exemplified. However, the present invention is not limited to these units. For example, the present invention may be applied to various other logic circuits such as a digital-to-analog converter, an adder, a subtracter, and the like, thus obtaining the same effects as described above. When the present invention is applied to a D/A converter, in particular, if the capacitance of the input terminal for receiving LSB data is represented by C, the capacitances need only be set to be twice as large as the immediately preceding value toward the most significant bit like 2C, 4C, 8C, . . . , thus realizing a binary D/A converter. In this case, the outputs from the commonly connected terminals of the capacitors can be received by a source follower amplifier.

As described above, in the circuit block in which the terminals on one side of the capacitor corresponding to multiple input terminals are commonly connected to the input of the sense amplifier, when the minimum one of capacitances connected to the multiple input terminals is represented by C, the total of the capacitances of the capacitor is an almost odd multiple of C.

When a correlation operating device has no control input terminal, all the capacitances connected to the input terminals have a minimum value. On the other hand, when the correlation operating device has control input terminals, as has been described above in the above embodiment, the capacitances connected to the control input terminals are even multiples of C like 2C and 4C, and a total of the capacitances of these terminals and an odd number of input signal terminals is an almost odd multiple of the unit capacitance C. With this arrangement, comparison with a desired reference value can be clearly attained, thus improving arithmetic operation precision.

The correlation operating device has been exemplified. In the case of a binary D/A converter, if the signal input capacitance of the least significant bit (LSB) is represented by C, the capacitance of the next bit is 2C, that of the second next bit is 4C, and the like, i.e., the capacitance of each bit assumes a value twice as large as the immediately preceding bit, and a total of capacitances of multiple input terminals becomes substantially an odd multiple of C, thus realizing a high-precision D/A converter. As for the A/D converter, the number of determination points for determining if the analog signal level is higher than or lower than ½ of the full range is set to be an odd number, i.e., 1, and the number of determination points for determining if the signal level is higher than or lower than ¼, ⅔, ¾, or ¼ of the full range is also set to be an odd number, i.e., 3. Thus, the total of the capacitances connected to the multiple input terminals can be set to be substantially an odd multiple of the minimum capacitance value. Since this arrangement can attain a high-precision arithmetic operation, arithmetic operations with lower consumption power and higher speed can be realized without arranging any unnecessary large capacitances.

Fourth Embodiment

FIG. 10 shows a preferred arrangement of the fourth embodiment of the present invention. In the fourth embodiment, a semiconductor device of the present invention is applied to a motion detection device for dynamic images or the like. Referring to FIG. 10, the apparatus includes memory units 61 and 62 for respectively storing standard data and reference data, a correlation calculation unit 63, a control unit 64 for controlling the entire chip, an addition calculation unit 65 for adding the correlation results, a register 66 for holding a minimum value of the sums from the addition calculation unit 65, a unit 67 serving as a comparator and a unit for storing the address of the minimum value, and a unit 68 serving as an output buffer and an output result storage unit. A terminal 69 receives a standard data string, and a terminal 70 receives a reference data string to be compared with the standard data string.

The memory units 61 and 62 comprise, e.g., SRAMs, and are constituted by conventional CMOS circuits. Data supplied to the correlation operating unit 63 can be processed by parallel processing since the unit 63 comprises a correlation operating device of the present invention. For this reason, the unit 63 can not only attain very high-speed processing, but also be constituted by a smaller number of elements, thus reducing the chip size and cost. The correlation calculation result is scored (evaluated) by the addition calculation unit 65, and is compared with the contents of the register 66 which stores the maximum correlation calculation result (minimum sum) before the current correlation calculation by the unit 67. If the current calculation result is smaller than the previous minimum value, the current result is newly stored in the register 66; if the previous result is smaller than the current result, the previous result is maintained.

With this operation, the maximum correlation arithmetic operation result is always stored in the register 66, and upon completion of calculations of all the data strings, the final correlation result is output from a terminal 71. The control unit 64, the addition calculation unit 65, the register 66, and the units 67 and 68 can be constituted by a conventional CMOS circuit in this apparatus. In particular, when the addition calculation unit 65 adopts the circuit arrangement of the present invention, parallel additions can be realized, thus realizing high-speed processing. As has been described above, with the application of the present invention, not only high-speed processing and low cost are realized but also the consumption current can be reduced since arithmetic operations are executed on the basis of capacitances, thus realizing low consumption power. For this reason, the present invention can be suitably applied to a portable equipment such as an 8-mm VTR camera or the like.

Fifth Embodiment

The fifth embodiment of the present invention will be described with reference to FIGS. 11A to 11C. The fifth embodiment presents a chip arrangement which performs high-speed image processing before image data is read out upon combination of the techniques of the present invention and an optical sensor (solid-state image pickup element).

Figure 11A:
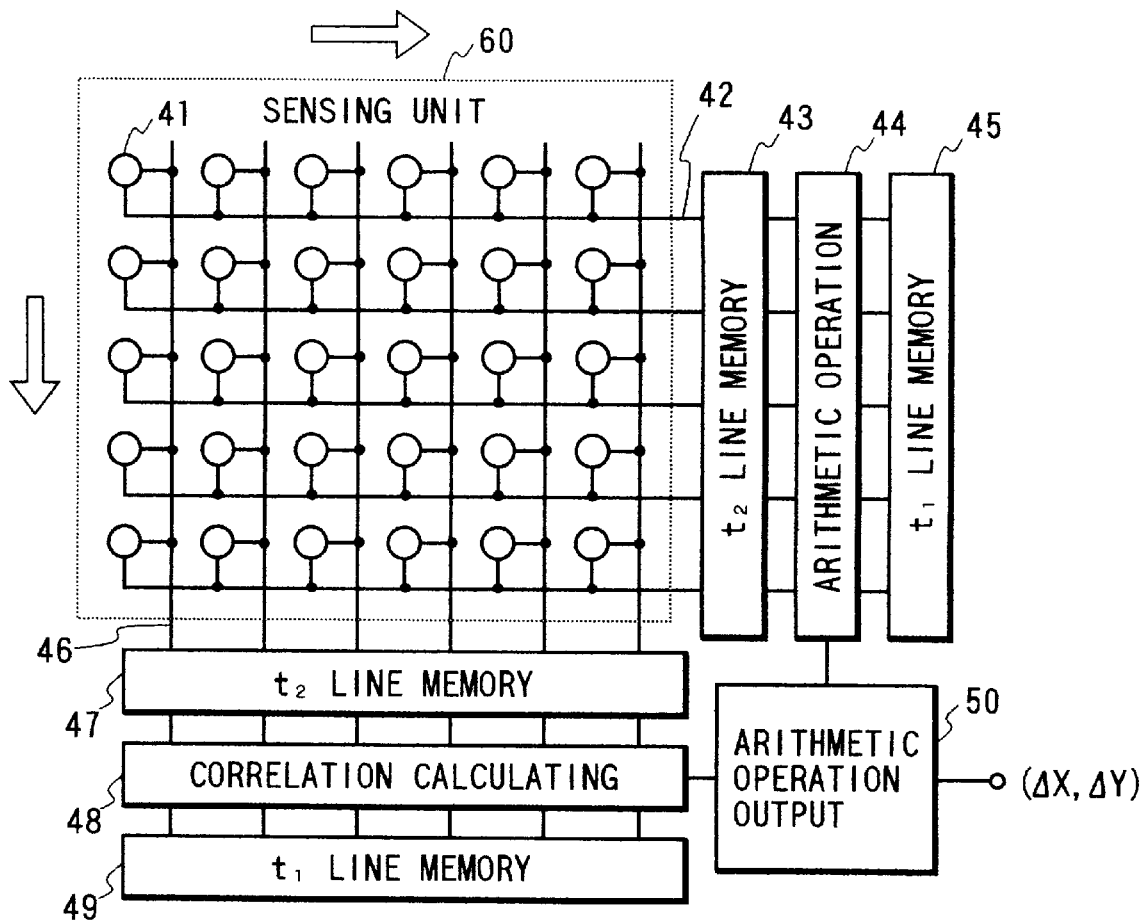
FIG. 11A is a schematic block diagram for explaining a case wherein the present invention is applied to a signal processing system like an image processing apparatus.
Figure 11B:
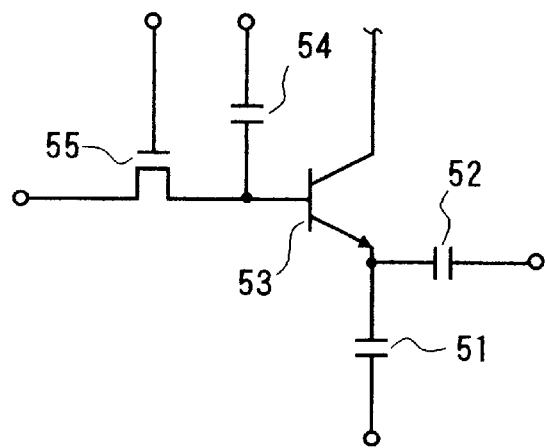
FIG. 11B is a schematic circuit diagram for explaining an example of the arrangement of a light-receiving portion in FIG. 11A.

FIG. 11A is a schematic block diagram showing the overall arrangement of the chip of the present invention. FIG. 11B is a schematic circuit diagram showing the arrangement of a pixel portion of the chip of the present invention. FIG. 11C is a view for explaining the arithmetic operation contents of the chip of the present invention.

Referring to FIG. 11A, the chip includes light-receiving portions 41 including photoelectric conversion elements arranged in the form of a matrix to constitute an image data sensing unit 60, line memory units 43, 45, 47, and 49, correlation calculating units 44 and 48, and an arithmetic operation output unit 50. FIG. 11B shows an example of the light-receiving portion 41. This portion includes coupling capacitor 51 and 52 for respectively connecting the optical signal output terminals of a bipolar transistor and output bus lines 42 and 46 in FIG. 11A, a capacitor 54 connected to the base region of the bipolar transistor, and a switch MOS transistor 55. Image data input to the image data sensing unit 60 is photoelectrically converted by the base region of each bipolar transistor 53.

An output corresponding to the photoelectrically converted photocarriers is read out to the emitter of the bipolar transistor 53, and raises the potentials of the output bus lines 42 and 46 in correspondence with the input storage charge signal via the capacitor 51 and 52. With the above-mentioned operation, the sum of the outputs from the pixels in the column direction is read out to the memory unit 47, and the sum of the outputs from the pixels in the row direction is read out to the memory unit 43. In this case, if a region where the base potential of the bipolar transistor is raised via the capacitor 54 of each pixel portion is selected using, e.g., a decoder (not shown in FIGS. 11A to 11C), the sums in the X- and Y-directions of an arbitrary region on the sensing unit 60 can be output.

Figure 11C:
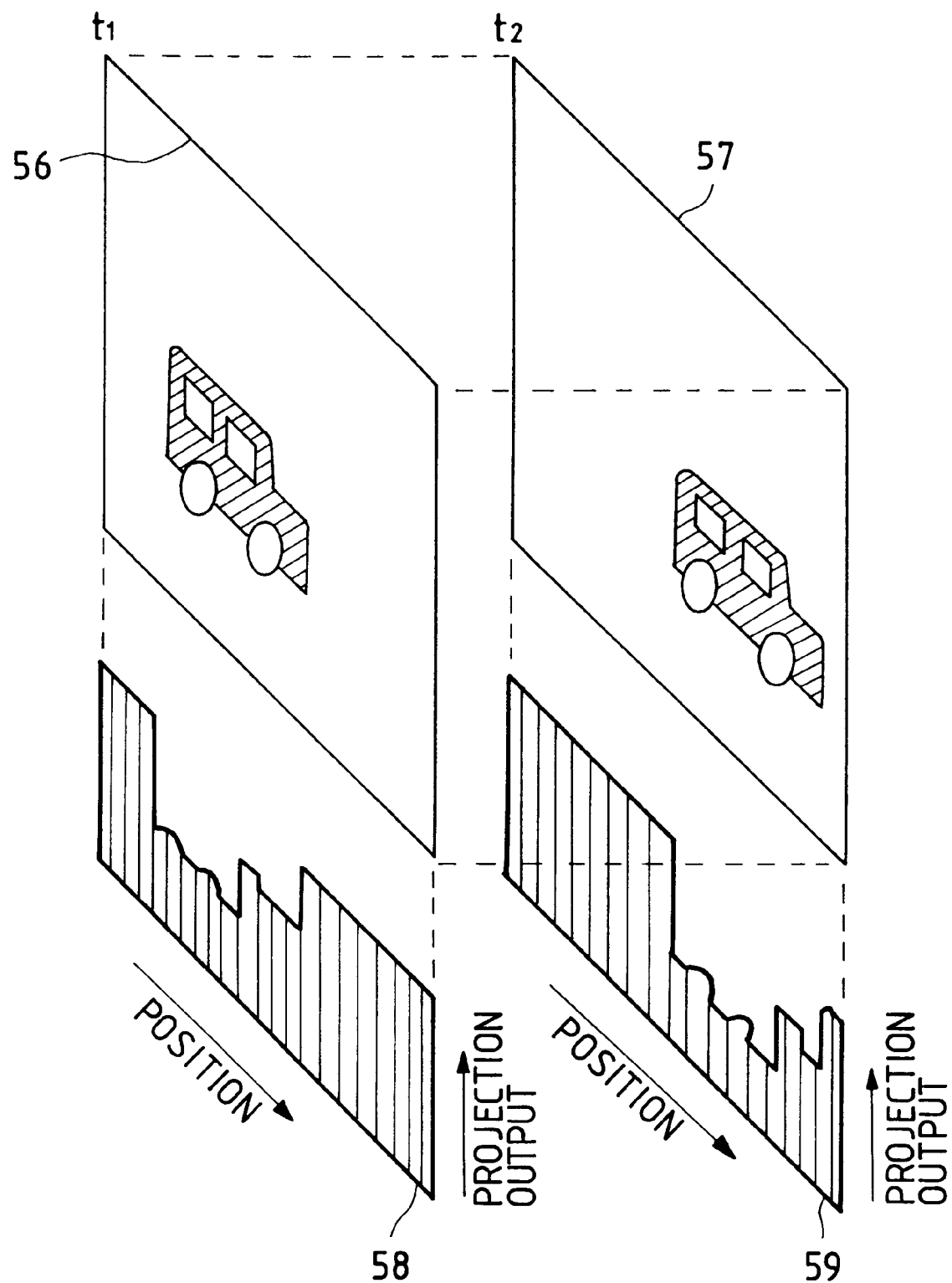
FIG. 11C is a view for explaining an example of the operation of the signal processing system shown in FIG. 11A.

In the above-mentioned arrangement, as shown in FIG. 11C, when an image 56 is input at time $t_1$, and an image 57 is input at time $t_2$, output results 58 and 59 obtained by respectively adding these images in the Y-direction become projection outputs corresponding to image positions. That is, it can be analyzed that the output results become image signals representing the moving state of a vehicle shown in FIG. 11C. These data are respectively stored in the line memories 47 and 49 shown in FIG. 11A. Similarly, data obtained by adding image data in the X-direction are stored in the line memories 43 and 45.

As can be seen from the output results 58 and 59 shown in FIG. 11C, the data of the two images shift in correspondence with the motion of the image. Thus, when the correlation calculating unit 48 calculates the shift amount, the motion of an object on the two-dimensional plane can be detected by a very simple method.

The correlation operating circuit of the present invention described above can be applied to the correlation calculating units 44 and 48 shown in FIG. 11A. Each of these units has a smaller number of elements than the conventional circuit, and, in particular, can be at the sensor pixel pitch. This arrangement performs arithmetic operations on the basis of analog signals output from the area sensor. However, when the A/D converter of the present invention is arranged between each line memory unit and the output bus line, a digital correlation arithmetic operation can be realized, needless to say.

The sensor element of the present invention comprises a bipolar transistor. However, the present invention is also effective for a MOS transistor or only a photodiode without arranging any amplification transistor.

Furthermore, this embodiment performs a correlation arithmetic operation between data strings at different times. Alternatively, when the X- and Y-projection results of a plurality of pattern data to be recognized are stored in one memory, pattern recognition can also be realized.

As described above, when the pixel input unit and the correlation arithmetic operation circuit and the like of the present invention are combined, the following effects are expected.

(1) Since data which are parallelly and simultaneously read out from the sensor are subjected to parallel processing unlike in the processing for serially reading out data from the sensor, high-speed motion detection and pattern recognition processing can be realized.

(2) Since image processing can be realized by one sensor chip without increasing the size of peripheral circuits, the following high-grade function products can be realized with low cost: (a) control for turning the TV screen toward the user direction, (b) control for turning the wind direction of an air conditioner toward the user direction, (c) tracing control of an 8-mm VTR camera, (d) label recognition in a factory, (e) manufacture of a reception robot that can automatically recognize a person, and (f) manufacture of an inter-vehicle distance controller for a vehicle. The combination of the image input unit and the circuit of the present invention has been described. The present invention is effective not only for image data but also for, e.g., recognition processing of audio data.

As shown in FIG. 2, the capacitance values to be reset via the reset switches 7 and 1 change depending on whether the switch 13 is enabled or disabled. That is, when the switch 13 is disabled, the load capacitance (2–A) decreases. The time required for resetting can be shortened accordingly.

In this embodiment, the total operation time can be shortened by changing the reset time depending on the state of the switch 13. Referring to FIG. 2, the capacitance of the capacitor 2-A is set to be the capacitance C, and one switch 13 is used. If, however, as described above, various capacitance values are prepared, and the number of switches is increased, the reset time can be greatly shortened, and the operation precision can be greatly improved.

As has been described above, according to the present invention, the capacitors are connected to the multiple input terminals via the first switch means, the terminals at one side of the capacitors are commonly connected to the sense amplifier, and at least some of the capacitors are connected to the sense amplifier via the second switch means. With this arrangement, various effects such as a small circuit scale, a high operation speed, and a high operation precision can be obtained.

In addition, a small circuit scale, a high operation speed, and a high operation precision can be achieved by using this semiconductor device for a semiconductor circuit such as a majority arithmetic operation circuit or a comparator or using and applying some or all of the correlation arithmetic operation circuit, the A/D converter, and the D/A converter to a signal processing circuit.

Note that the present invention is not limited to the above embodiments and description, and appropriate modifications may be made within the scope of the invention. In addition, as is apparent, the semiconductor device and the semiconductor circuit of the present invention can be applied to devices and circuits other than those described above.

What is claimed is:

1. A semiconductor device provided with a circuit, comprising:

multiple input terminals;

plural capacitor elements each having (a) a first terminal provided correspondingly to a respective one of said multiple input terminals and (b) a second terminal in opposition to said first terminal, said capacitor elements being divided into first and second groups;

plural first switch means respectively arranged between said multiple input terminals and said first terminals;

a sense amplifier connected commonly to said first and second groups; and second switch means, wherein said second terminals of said capacitor elements of said first group are connected to said sense amplifier, and said second terminals of said capacitor elements of said second group are connected through said second switch means to said sense amplifier.

2. A device according to claim 1, further comprising a latch means, wherein an output from said sense amplifier is connected to at least one of said multiple input terminals through said latch means.

3. A device according to claim 1, wherein said sense amplifier has an input terminal, said device further comprising reset means for resetting said input terminal of said sense amplifier.

4. A device according to claim 1, wherein said second switch means is provided correspondingly to said capacitor element to which said second switch means is connected.

5. A semiconductor circuit provided with plural circuits, comprising:

multiple input terminals;

plural capacitor elements each having (a) a first terminal provided correspondingly to respective ones of said multiple input terminals and (b) a second terminal in opposition to said first terminal;

plural first switch means respectively arranged between said multiple input terminals and said first terminals;

a sense amplifier connected commonly to said second terminals; and second switch means, wherein at least some of said second terminals of said capacitor elements of said semiconductor circuit are connected through said second switch means to said sense amplifier, and an output and/or an inverted output from a first circuit among said plural circuits is inputted into a second circuit among said plural circuits.

6. A device according to claim 5, wherein, when a minimum capacitance of said capacitor elements corresponding to the input terminal of said semiconductor circuit is designated as C, a total sum of the capacitances of the capacitor elements commonly connected equals substantially an odd multiple of C.

7. A device according to claim 6, wherein said semiconductor circuit constitutes at least a part of a circuit performing an correlation arithmetic operation in comparison with a correlation factor.

8. A semiconductor circuit according to claim 5, wherein said second switch means is provided correspondingly to said capacitor element to which said second switch means is connected.

9. A signal converter provided with a circuit, comprising:

multiple input terminals;

plural capacitor elements each having a first terminal provided correspondingly to a respective one of said multiple input terminals and a second terminal in opposition to said first terminal;

plural first switch means respectively arranged between said multiple input terminals and said first terminals; and a sense amplifier connected commonly to said second terminals, wherein said signal converter receives as input an analog signal from said multiple input terminals for outputting a digital signal corresponding to the analog signal, and further comprising second switch means, wherein at least some of the second terminals of said capacitor elements are connected through said second switch means to said sense amplifier, and said semiconductor circuit constitutes at least a part of an A/D converter.

10. A signal converter according to claim 9, wherein said second switch means is provided correspondingly to said capacitor element to which said second switch means is connected.

11. A signal converter provided with a circuit, comprising:

multiple input terminals;

plural capacitor elements each having a first terminal provided correspondingly to a respective one of said multiple input terminals and a second terminal in opposition to said first terminal;

plural first switch means respectively arranged between said multiple input terminals and said first terminals; and a sense amplifier connected commonly to said second terminals, whereby a digital signal is input from said multiple input terminals and an analog signal corresponding to the digital signal is output, and further comprising second switch means, wherein at least some of the second terminals of said capacitor elements are connected through said second switch means to said sense amplifier, and said semiconductor circuit constitutes at least a part of a D/A converter.

12. A signal converter according to claim 11, wherein said second switch means is provided correspondingly to said capacitor element to which said second switch means is connected.

13. A signal processing system comprising:

a semiconductor device provided with a circuit, comprising:

multiple input terminals;

plural capacitor elements wach having a first terminal provided correspondingly to a respective one of said multiple input terminals and a second terminal in opposition to said first terminal;

plural first switch means respectively arranged between said multiple input terminals and said first terminals; and a sense amplifier connected commonly to said second terminals; and second switch means, wherein at least soome of the second terminals of said capacitor elements are connected through said second switch means to said sense amplifier; and means for outputting a signal inputted into said semiconductor device.

14. A system according to claim 13, further comprising an image input device for inputting an image signal.

15. A system according to claim 13, further comprising a storage device for storing information.

16. A device according to claim 15, wherein a time for the reset operation of said reset means changes according to a continuity/discontinuity of said second switch means.

17. A system according to claim 13, wherein said semiconductor circuit constitutes at least a part of A/D converter.

18. A system according to claim 13, wherein said semiconductor circuit constitutes at least a part of a D/A converter.

19. A signal processing system according to claim 13, wherein said second switch means is provided correspondingly to said capacitor element to which said second switch means is connected.

* * * * *

UNITED STATES PATENT AND TRADEMARK OFFICE
CERTIFICATE OF CORRECTION

PATENT NO. : 6,081,825
DATED : June 27, 2000
INVENTOR(S) : TETSUNOBU KOHCHI ET AL.

It is certified that error appears in the above-identified patent and that said Letters Patent is hereby corrected as shown below:

COLUMN 2:

Line 7, "circuit," should read --circuit--;
    Line 8, "known" should be deleted; and
            "circuit as" should read --circuit, known as--; and
    Line 31, "capacitor" should read --capacitors--.

COLUMN 3:

Line 24, "capacitor." should read --capacitors.--.

COLUMN 4:

Line 35, "ORES" should read --$\phi$RES--.

COLUMN 7:

Line 33, "output 11." should read --output terminal 11.--; and
    Line 38, "11" should read --terminal 11--.

COLUMN 9:

Line 54, "outputs" should read --output--.

COLUMN 11:

Line 61, "capacitor 51" should read --capacitors 51--.

UNITED STATES PATENT AND TRADEMARK OFFICE
CERTIFICATE OF CORRECTION

PATENT NO. : 6,081,825
DATED : June 27, 2000
INVENTOR(S) : TETSUNOBU KOHCHI ET AL.

It is certified that error appears in the above-identified patent and that said Letters Patent is hereby corrected as shown below:

COLUMN 12:

Line 5, "capacitor 51" should read --capacitors 51--.

COLUMN 14:

Line 35, "an" should read --a--.

COLUMN 15:

Line 27, "wach" should read --each--.

UNITED STATES PATENT AND TRADEMARK OFFICE
CERTIFICATE OF CORRECTION

PATENT NO. : 6,081,825
DATED : June 27, 2000
INVENTOR(S) : TETSUNOBU KOHCHI ET AL.

Page 3 of 3

It is certified that error appears in the above-identified patent and that said Letters Patent is hereby corrected as shown below:

<u>COLUMN 16</u>:

Line 7,  "soome" should read --some--;
    Line 21, "of A/D converter." should read
            --of an A/D converter.--.

Signed and Sealed this

Twenty-second Day of May, 2001

Attest:

NICHOLAS P. GODICI

Attesting Officer     Acting Director of the United States Patent and Trademark Office